United States Patent
Loveland et al.

(10) Patent No.: US 9,501,700 B2
(45) Date of Patent: Nov. 22, 2016

(54) SYSTEM AND METHOD FOR CONSTRUCTION ESTIMATION USING AERIAL IMAGES

(75) Inventors: James Edward Loveland, Alpine, UT (US); Jeffrey Clayton Taylor, Pleasant Grove, UT (US); Jeffery Devon Lewis, Provo, UT (US); Bradley McKay Childs, Lehi, UT (US); Corey David Reed, Cedar Hills, UT (US); Jared William Robertson, Orem, UT (US)

(73) Assignee: Xactware Solutions, Inc., Orem, UT (US)

( * ) Notice: Subject to any disclaimer, the term of this patent is extended or adjusted under 35 U.S.C. 154(b) by 152 days.

(21) Appl. No.: 13/397,325

(22) Filed: Feb. 15, 2012

(65) Prior Publication Data
US 2013/0211790 A1    Aug. 15, 2013

(51) Int. Cl.
| G06G 7/48 | (2006.01) |
|---|---|
| G06K 9/00 | (2006.01) |
| G06T 7/00 | (2006.01) |
| G06F 17/50 | (2006.01) |

(52) U.S. Cl.
CPC ........... *G06K 9/00637* (2013.01); *G06F 17/50* (2013.01); *G06T 7/0028* (2013.01)

(58) Field of Classification Search
CPC .................................................. G06T 7/0028
USPC ............................................................. 703/6
See application file for complete search history.

(56) References Cited

U.S. PATENT DOCUMENTS

| 3,908,281 A | 9/1975 | Fox |
|---|---|---|
| 4,845,643 A | 7/1989 | Clapp |
| 5,247,356 A | 9/1993 | Ciampa |
| 5,259,037 A | 11/1993 | Plunk |
| 5,276,866 A | 1/1994 | Paolini |
| 5,422,989 A | 6/1995 | Bell et al. |
| 5,592,375 A | 1/1997 | Salmon et al. |
| 5,633,995 A | 5/1997 | McClain |
| 5,666,441 A | 9/1997 | Rao et al. |
| 5,727,138 A | 3/1998 | Harada |

(Continued)

FOREIGN PATENT DOCUMENTS

| AU | 2008/230031 B8 | 7/2010 |
|---|---|---|
| EP | 1010966 A1 | 6/2000 |

(Continued)

OTHER PUBLICATIONS

Bhanu et al.: Adaptive Integrated Image Segmentation and Object Recognition; IEEE Trans. Systems, Man, and Cybernetics—Part C: Applications and Reviews, vol. 30, No. 4, Nov. 2000; 427-441.*

(Continued)

*Primary Examiner* — Hugh Jones
(74) *Attorney, Agent, or Firm* — McCarter & English, LLP

(57) ABSTRACT

A system and method for construction estimation using aerial images is provided. The system receives at least one aerial image of a building. An estimation engine processes the aerial image at a plurality of angles to automatically identify a plurality of (e.g., perimeter and interior) lines in the image corresponding to a plurality of features of a roof the building. The estimation engine allows users to generate two-dimensional and three-dimensional models of the roof by automatically delineating various roof features, and generates a report including information about the roof of the building.

34 Claims, 15 Drawing Sheets

(56) References Cited

U.S. PATENT DOCUMENTS

| | | |
|---|---|---|
| 5,983,010 A | 11/1999 | Murdock et al. |
| 6,037,945 A | 3/2000 | Loveland |
| 6,046,745 A | 4/2000 | Moriya et al. |
| 6,134,338 A | 10/2000 | Solberg et al. |
| 6,198,431 B1 | 3/2001 | Gibson |
| 6,323,885 B1 | 11/2001 | Wiese |
| 6,333,749 B1 | 12/2001 | Reinhardt et al. |
| 6,342,884 B1 | 1/2002 | Kamen et al. |
| 6,356,280 B1 | 3/2002 | Kamen et al. |
| 6,385,541 B1 | 5/2002 | Blumberg et al. |
| 6,396,491 B2 | 5/2002 | Watanabe et al. |
| 6,434,277 B1 | 8/2002 | Yamada et al. |
| 6,446,053 B1 | 9/2002 | Elliott |
| 6,448,964 B1 | 9/2002 | Isaacs et al. |
| 6,456,287 B1 | 9/2002 | Kamen et al. |
| 6,496,184 B1 | 12/2002 | Freeman et al. |
| 6,525,728 B2 | 2/2003 | Kamen et al. |
| 6,556,195 B1 | 4/2003 | Totsuka et al. |
| 6,581,045 B1 | 6/2003 | Watson |
| 6,636,803 B1 | 10/2003 | Hartz, Jr. et al. |
| 6,810,383 B1 | 10/2004 | Loveland |
| 6,816,819 B1 | 11/2004 | Loveland |
| 6,826,539 B2 | 11/2004 | Loveland |
| 6,829,584 B2 | 12/2004 | Loveland |
| 6,836,270 B2 | 12/2004 | Du |
| 6,912,293 B1 | 6/2005 | Korobkin |
| 6,980,690 B1 | 12/2005 | Taylor et al. |
| 6,982,712 B2 | 1/2006 | Ohto |
| 7,003,400 B2 | 2/2006 | Bryant |
| 7,006,977 B1 | 2/2006 | Attra et al. |
| 7,098,909 B2 | 8/2006 | Hayano et al. |
| 7,133,551 B2 | 11/2006 | Chen et al. |
| 7,149,346 B2 | 12/2006 | Oniyama |
| 7,164,883 B2 | 1/2007 | Rappaport et al. |
| 7,187,452 B2 | 3/2007 | Jupp et al. |
| 7,246,044 B2 | 7/2007 | Imamura et al. |
| 7,305,983 B1 | 12/2007 | Meder et al. |
| 7,324,666 B2 | 1/2008 | Zoken et al. |
| 7,343,268 B2 | 3/2008 | Kishikawa |
| 7,376,284 B2 | 5/2008 | Tao et al. |
| 7,386,164 B2 | 6/2008 | Shragai et al. |
| 7,421,125 B1 | 9/2008 | Rees |
| 7,424,133 B2 | 9/2008 | Schultz et al. |
| 7,444,013 B2 | 10/2008 | Chen |
| 7,487,114 B2 | 2/2009 | Florance et al. |
| 7,508,977 B2 | 3/2009 | Lyons et al. |
| 7,509,241 B2 | 3/2009 | Guo et al. |
| 7,515,153 B2 | 4/2009 | Jin et al. |
| 7,519,206 B2 | 4/2009 | Mulet-Parada et al. |
| 7,720,276 B1 | 5/2010 | Korobkin |
| 7,728,833 B2 | 6/2010 | Verma et al. |
| 7,752,018 B2 | 7/2010 | Rahmes et al. |
| 7,787,659 B2 | 8/2010 | Schultz et al. |
| 7,804,996 B2 | 9/2010 | Ohtomo et al. |
| 7,869,981 B2 | 1/2011 | Pendyala et al. |
| 7,873,238 B2 | 1/2011 | Schultz et al. |
| 7,920,963 B2 | 4/2011 | Jouline et al. |
| 7,961,982 B2 | 6/2011 | Sibiryakov et al. |
| 7,991,226 B2 | 8/2011 | Schultz et al. |
| 7,995,799 B2 | 8/2011 | Schultz et al. |
| 7,995,862 B2 | 8/2011 | Tao et al. |
| 8,040,343 B2 | 10/2011 | Kikuchi et al. |
| 8,059,888 B2 | 11/2011 | Chen et al. |
| 8,068,643 B2 | 11/2011 | Schultz et al. |
| 8,078,396 B2 | 12/2011 | Meadow et al. |
| 8,078,436 B2 | 12/2011 | Pershing et al. |
| 8,081,841 B2 | 12/2011 | Schultz et al. |
| 8,099,264 B2 | 1/2012 | Kelley et al. |
| 8,131,514 B2 | 3/2012 | Royan et al. |
| 8,145,578 B2 | 3/2012 | Pershing et al. |
| 8,154,633 B2 | 4/2012 | Gloudemans et al. |
| 8,170,840 B2 | 5/2012 | Pershing |
| 8,204,341 B2 | 6/2012 | Schultz et al. |
| 8,207,964 B1 | 6/2012 | Meadow et al. |
| 8,209,152 B2 | 6/2012 | Pershing |
| 8,233,666 B2 | 7/2012 | Schultz et al. |
| 8,331,654 B2 | 12/2012 | Abraham et al. |
| 8,385,672 B2 | 2/2013 | Giuffrida et al. |
| 8,401,222 B2 | 3/2013 | Thornberry et al. |
| 8,452,125 B2 | 5/2013 | Schultz et al. |
| 8,477,190 B2 | 7/2013 | Giuffrida et al. |
| 8,515,125 B2 | 8/2013 | Thornberry et al. |
| 8,515,198 B2 | 8/2013 | Giuffrida et al. |
| 8,520,079 B2 | 8/2013 | Schultz et al. |
| 8,531,472 B2 | 9/2013 | Freund et al. |
| 8,542,880 B2 | 9/2013 | Thornberry et al. |
| 8,588,547 B2 | 11/2013 | Giuffrida et al. |
| 8,593,518 B2 | 11/2013 | Schultz et al. |
| 8,630,510 B2 | 1/2014 | Giuffrida et al. |
| 8,634,594 B2 | 1/2014 | Schultz et al. |
| 8,634,597 B2 | 1/2014 | Ivanov et al. |
| 8,643,720 B2 | 2/2014 | Schultz et al. |
| 8,648,872 B2 | 2/2014 | Freund et al. |
| 8,649,596 B2 | 2/2014 | Schultz et al. |
| 8,660,382 B2 | 2/2014 | Schultz et al. |
| 8,670,961 B2 | 3/2014 | Pershing et al. |
| 8,731,234 B1 | 5/2014 | Ciarcia et al. |
| 8,774,525 B2 | 7/2014 | Pershing |
| 8,818,076 B2 | 8/2014 | Shenkar et al. |
| 8,818,770 B2 | 8/2014 | Pershing |
| 8,823,732 B2 | 9/2014 | Adams et al. |
| 8,825,454 B2 | 9/2014 | Pershing |
| 8,855,442 B2 | 10/2014 | Owechko |
| 8,938,090 B2 | 1/2015 | Thornberry et al. |
| 8,970,615 B2 | 3/2015 | Freund et al. |
| 8,971,624 B2 | 3/2015 | Schultz et al. |
| 8,977,520 B2 | 3/2015 | Stephens et al. |
| 8,995,757 B1 | 3/2015 | Ciarcia et al. |
| 9,014,415 B2 | 4/2015 | Chen et al. |
| 9,036,861 B2 | 5/2015 | Chen et al. |
| 9,047,688 B2 | 6/2015 | Lynch |
| 9,070,018 B1 | 6/2015 | Ciarcia et al. |
| 9,129,376 B2 | 9/2015 | Pershing |
| 9,135,737 B2 | 9/2015 | Pershing |
| 9,141,880 B2 | 9/2015 | Ciarcia |
| 9,147,276 B2 | 9/2015 | Giuffrida et al. |
| 9,147,287 B2 | 9/2015 | Ciarcia |
| 9,159,164 B2 | 10/2015 | Ciarcia |
| 9,182,657 B2 | 11/2015 | Schultz et al. |
| 9,183,538 B2 | 11/2015 | Thornberry et al. |
| 2001/0027404 A1 | 10/2001 | Loveland |
| 2002/0061132 A1 | 5/2002 | Furukawa |
| 2002/0076098 A1 | 6/2002 | Love |
| 2002/0154174 A1 | 10/2002 | Redlich et al. |
| 2002/0167515 A1 | 11/2002 | Kamen et al. |
| 2003/0014224 A1 | 1/2003 | Guo et al. |
| 2003/0023412 A1 | 1/2003 | Rappaport et al. |
| 2003/0028393 A1 | 2/2003 | Coulston et al. |
| 2003/0088362 A1 | 5/2003 | Melero et al. |
| 2003/0115163 A1 | 6/2003 | Moore et al. |
| 2003/0147553 A1 | 8/2003 | Chen et al. |
| 2003/0171957 A1 | 9/2003 | Watrous |
| 2003/0233310 A1 | 12/2003 | Stavrovski |
| 2004/0047498 A1 | 3/2004 | Mulet-Parada et al. |
| 2004/0105573 A1 | 6/2004 | Neumann et al. |
| 2004/0220906 A1 | 11/2004 | Gargi et al. |
| 2004/0263514 A1 | 12/2004 | Jin et al. |
| 2004/0264763 A1 | 12/2004 | Mas et al. |
| 2005/0012742 A1 | 1/2005 | Royan |
| 2005/0102394 A1 | 5/2005 | Loveland |
| 2005/0203768 A1 | 9/2005 | Florance et al. |
| 2005/0288959 A1 | 12/2005 | Eraker et al. |
| 2006/0056732 A1 | 3/2006 | Holmes |
| 2006/0061566 A1 | 3/2006 | Verma et al. |
| 2006/0136126 A1 | 6/2006 | Coombes et al. |
| 2006/0137736 A1 | 6/2006 | Nishitani et al. |
| 2006/0188143 A1 | 8/2006 | Strassenburg-Kleciak |
| 2006/0200311 A1 | 9/2006 | Arutunian et al. |
| 2006/0232605 A1 | 10/2006 | Imamura |
| 2006/0239537 A1 | 10/2006 | Shragai et al. |
| 2006/0262112 A1 | 11/2006 | Shimada |
| 2006/0265287 A1 | 11/2006 | Kubo |
| 2007/0036467 A1 | 2/2007 | Coleman et al. |
| 2007/0067191 A1 | 3/2007 | Loveland |

(56) References Cited

U.S. PATENT DOCUMENTS

| | | |
|---|---|---|
| 2007/0115284 A1 | 5/2007 | Kim et al. |
| 2007/0150366 A1 | 6/2007 | Yahiro et al. |
| 2007/0220174 A1 | 9/2007 | Abhyanker |
| 2008/0021683 A1 | 1/2008 | Rahmes et al. |
| 2008/0068379 A1 | 3/2008 | Larsen et al. |
| 2008/0071604 A1 | 3/2008 | Scanlan |
| 2008/0089610 A1 | 4/2008 | Tao et al. |
| 2008/0103991 A1 | 5/2008 | Moore et al. |
| 2008/0105045 A1 | 5/2008 | Woro |
| 2008/0162380 A1 | 7/2008 | Suga et al. |
| 2008/0204570 A1 | 8/2008 | Schultz et al. |
| 2008/0221843 A1 | 9/2008 | Shenkar et al. |
| 2008/0231700 A1 | 9/2008 | Schultz et al. |
| 2008/0262789 A1 | 10/2008 | Pershing et al. |
| 2008/0273753 A1 | 11/2008 | Giuffrida et al. |
| 2008/0279447 A1 | 11/2008 | Friedlander et al. |
| 2008/0310756 A1 | 12/2008 | Tao et al. |
| 2009/0089018 A1 | 4/2009 | Kelley et al. |
| 2009/0110327 A1 | 4/2009 | Chen et al. |
| 2009/0132210 A1 | 5/2009 | Royan et al. |
| 2009/0132436 A1 | 5/2009 | Pershing et al. |
| 2009/0141020 A1 | 6/2009 | Freund et al. |
| 2009/0216501 A1 | 8/2009 | Yeow et al. |
| 2009/0234692 A1 | 9/2009 | Powell et al. |
| 2009/0271154 A1 | 10/2009 | Coad et al. |
| 2009/0304227 A1 | 12/2009 | Kennedy et al. |
| 2009/0310867 A1 | 12/2009 | Matei et al. |
| 2010/0034483 A1 | 2/2010 | Giuffrida et al. |
| 2010/0060631 A1 | 3/2010 | Sugihara |
| 2010/0110074 A1 | 5/2010 | Pershing |
| 2010/0114537 A1 | 5/2010 | Pershing |
| 2010/0164953 A1 | 7/2010 | Wouhaybi et al. |
| 2010/0179787 A2 | 7/2010 | Pershing et al. |
| 2010/0182316 A1 | 7/2010 | Akbari et al. |
| 2010/0201682 A1 | 8/2010 | Quan et al. |
| 2010/0217724 A1 | 8/2010 | Wayne et al. |
| 2010/0241406 A1 | 9/2010 | Rahmes et al. |
| 2010/0275018 A1 | 10/2010 | Pedersen |
| 2010/0296693 A1 | 11/2010 | Thornberry et al. |
| 2010/0303340 A1 | 12/2010 | Abraham et al. |
| 2011/0047048 A1 | 2/2011 | Yahiro et al. |
| 2011/0096083 A1 | 4/2011 | Schultz |
| 2011/0157213 A1 | 6/2011 | Takeyama et al. |
| 2011/0164029 A1 | 7/2011 | King et al. |
| 2011/0187713 A1 | 8/2011 | Pershing et al. |
| 2011/0205245 A1 | 8/2011 | Kennedy et al. |
| 2011/0222757 A1 | 9/2011 | Yeatman, Jr. et al. |
| 2012/0007982 A1 | 1/2012 | Giuffrida et al. |
| 2012/0026322 A1 | 2/2012 | Malka et al. |
| 2012/0101783 A1 | 4/2012 | Stephens et al. |
| 2012/0154446 A1 | 6/2012 | Adams et al. |
| 2012/0170797 A1 | 7/2012 | Pershing et al. |
| 2012/0183217 A1 | 7/2012 | Schultz et al. |
| 2012/0191424 A1 | 7/2012 | Pershing |
| 2012/0209782 A1 | 8/2012 | Pershing et al. |
| 2012/0223965 A1 | 9/2012 | Pershing |
| 2012/0253725 A1 | 10/2012 | Malka et al. |
| 2012/0253751 A1 | 10/2012 | Malka et al. |
| 2012/0288158 A1 | 11/2012 | Schultz et al. |
| 2013/0113831 A1 | 5/2013 | Giuffrida et al. |
| 2013/0135471 A1 | 5/2013 | Giuffrida et al. |
| 2013/0138401 A1 | 5/2013 | Thornberry et al. |
| 2013/0170694 A1 | 7/2013 | Thornberry et al. |
| 2013/0202157 A1 | 8/2013 | Pershing |
| 2013/0204575 A1 | 8/2013 | Pershing |
| 2013/0208116 A1 | 8/2013 | Schultz et al. |
| 2013/0208996 A1 | 8/2013 | Schultz et al. |
| 2013/0211790 A1 | 8/2013 | Loveland et al. |
| 2013/0212536 A1 | 8/2013 | Thornberry et al. |
| 2013/0226515 A1 | 8/2013 | Pershing et al. |
| 2014/0064554 A1 | 3/2014 | Coulter et al. |
| 2015/0370929 A1 | 12/2015 | Pershing |

FOREIGN PATENT DOCUMENTS

| | | |
|---|---|---|
| WO | 00/29806 A2 | 5/2000 |
| WO | 2004/044692 A2 | 5/2004 |
| WO | 2005/124276 A2 | 12/2005 |
| WO | 2006/040775 A2 | 4/2006 |
| WO | 2006/090132 A2 | 8/2006 |
| WO | 2009/049151 A1 | 4/2009 |
| WO | 2009/073726 A1 | 6/2009 |
| WO | 2010/017255 A2 | 2/2010 |
| WO | 2011/056402 A2 | 5/2011 |
| WO | 2011094760 A2 | 8/2011 |
| WO | 2012/050648 A2 | 4/2012 |
| WO | 2012/054239 A2 | 4/2012 |
| WO | 2012/083135 A1 | 6/2012 |
| WO | 2013116164 A1 | 8/2013 |
| WO | 2013116165 A1 | 8/2013 |
| WO | 2013116793 A2 | 8/2013 |
| WO | 2013116794 A2 | 8/2013 |
| WO | 2014149509 A2 | 9/2014 |
| WO | 2014151122 A1 | 9/2014 |
| WO | 2015/081026 A1 | 6/2015 |

OTHER PUBLICATIONS

Choi et al.: Vehicle Detection from Aerial Images Using Local Shape Information; PSIVT 2009, LNCS 5414; Springer-Verlag Berlin Heidelberg; 2009; pp. 227-236.*

Collins et al.; Site Model Acquisition and Extension from Aerial Images; ICCV '95 Proc. 5th Int. Conf. Computer Vision; 1995; pp. 1-6.*

Kaufhold et al.: Recognition and Segmentation of Scene Content using Region-Based Classification; Proceedings of the 18th International Conference on Pattern Recognition (ICPR'06); 2006; pp. 1-6.*

Moscatelli et al.: Advanced Topics in Artificial Intelligence; Lecture Notes in Computer Science vol. 617, 1992, pp. 161-197.*

Nobel et al.: Histogram classification using vector quantization; Proc. 1994 IEEE Int. Symp. Information Theory; 1994; p. 391.*

Shafer et al.; Recursive region segmentation by analysis of histograms; Proc. IEEE Int. Conf. Acoustics, Speech, Signal Processing, 1982, pp. 1166-1171.*

Stilla et al.; Reconstruction of Building Models from Maps and Laser Altimeter Data; Agouris and Stefanidis (Eds.): ISD'99, LNCS1737, pp. 34-46, 1999.*

Ahonen et al. (Rotation invariant image description with local binary pattern histogram Fourier features); in text: Image Analysis, SCIA 2009 Proceedings, Lecture Notes in Computer Science 5575, 2009; pp. 61-70.*

"Xactimate 27—Aerial Sketch," Internet printout from http://www.xactware.com/solutions/claims-estimating/27-3/aerial-sketch, 2012 (3 pages).

International Search Report of the International Searching Authority mailed on Apr. 26, 2013, issued in connection with International Application No. PCT/US2013/26385 (2 pages).

Written Opinion mailed on Apr. 26, 2013, issued in connection with International Application No. PCT/US2013/26385 (4 pages).

Baillard, et al., "3-D Reconstruction of Urban Scenes from Aerial Stereo Imagery: A Focusing Strategy," Computer Vision and Image Understanding, vol. 76, No. 3 pp. 244-258, Dec. 1999.

Avrahami, et al., "Extraction of 3D Spatial Polygons Based on the Overlapping Criterion for Roof Extraction from Aerial Images," International Archives of Photogrammetry, Remote Sensing & Spatial Information Sciences, Aug. 29-30, 2005 (6 pages).

Applicad, "Product Bulletin- Nov. 2002: Key Features of Our Roofing Software," Nov. 2002 (46 pages).

Able Software Corp., "R2V User's Manual, Advanced Raster to Vector Conversion Software," Copyright 1994-2008 (167 pages).

Mikhail, et al., "Introduction to Modern Photogrammetry," John Wiley & Sons, Inc., New York, 2001 (pp. 33-79, 107-149, 276-300).

Gonzalez, et al., "Digital Image Processing," Addison-Wesley Publishing Company, Inc., 1993 (pp. 483-566-, 571-658).

Rupnik, et al., "Oblique Muiti-Camera Systems - Orientation and Dense Matching Issues," The International Archives of the

(56) References Cited

OTHER PUBLICATIONS

Photogrammetry, Remote Sensing and Spatial Information Sciences, vol. XL-3W1, 2014 (8 pages).

Lee, et al., "Fusion of Lidar and Imagery for Reliable Building Extraction," Photogrammetric Engineering and Remote Sensing, Feb. 2008 (11 pages).

Nazar, et al., "Reconstruction of Buildings from Airborne Laser Scanning Data," 2006 (10 pages).

Elaksher, et al., "Roof Boundary Extraction Using Multiple Images," Photogrammetric Record, Mar. 2003 (14 pages).

Written Opinion of the International Searching Authority mailed on Nov. 17, 2014, issued in connection with International Application No. PCP/US14/49605 (4 pages).

Verma, "3D Building Detection and Modeling from Aerial Lidar Data," IEEE, 2006 (8 pages).

San, et al., "Building Extraction from High Resolution Satellite images Using Hough Transform," International Archives of the Photogrammetry, Remote Sensing and Spatial Information Science, vol. XXXVIII, 2010(6 pages).

Preciozzi, "Dense Urban Elevation Models From Stereo Images by an Affine Region Merging Approach," Master Thesis, Universidad de la Republica, Montevideo, Sep. 18, 2006 (93 pages).

Pictometry International Corp., "Electronic Field Study User Guide," Version 2.7, Jul. 2007 (pp. 131-149, 183-210, 265-293, 303-358).

Noronha, et al., "Detection and Modeling of Buildings from Multiple Aerial Images," IEEE Transactions on Pattern Analysis and Machine Intelligence, vol. 23, No. 5, May 2001 (32 pages).

McKeown, Jr., et al., "Chapter 9: Feature Extraction and Object Recognition, Automatic Cartographic Feature Extraction Using Photogrammetric Principles," Digital Photogrammetry: An Addendum to the Manual of Photogrammetry, 1996 (19 pages).

Labe, et al., "Robust Techniques for Estimating Parameters of 3D Building Primitives," International Society for Photogrammetry and Remote Sensing, vol. XXXII, Part 2, Commission II, Proceedings of the Commission II Symposium, Data Integration: Systems and Techniques, Jul. 13-17, 1998 (11 pages).

Hsieh, "Design and Evaluation of a Semi-Automated Site Modeling System," Carnegie Mellon University, Nov. 1995 (83 pages).

\* cited by examiner

SYSTEM AND METHOD FOR CONSTRUCTION ESTIMATION USING AERIAL IMAGES

BACKGROUND OF THE INVENTION

1. Field of the Invention

The present invention relates generally to the field of construction estimation. More specifically, the present invention relates to a system and method for construction estimation using aerial images.

2. Related Art

In the construction and insurance industries, accurate and rapid estimation of construction materials and costs is important. For example, such information is often used by construction professionals to specify materials and associated costs for both newly-constructed buildings, as well as for replacing and upgrading existing structures. Further, in the insurance industry, accurate information about construction materials and costs is critical to determining the proper costs for insuring buildings/structures.

It is of particular importance in the construction and insurance industries to quickly and accurately estimate various parameters regarding roof structures, such as roof dimensions, pitches, surfaces, areas, and associated material costs. To this end, various software systems have been implemented to estimate roofing materials and roofing costs. Such systems process aerial images (e.g., using digital photographs taken from airplanes flying over buildings) and allow users to estimate construction materials and costs by delineating the bounds of a roof, and by calculating dimensions based upon the delineated bounds. However, such systems are time-consuming and difficult to use. Indeed, such systems often require a large amount of manual input by the user (e.g., by manually delineating roof boundaries using a mouse and graphical user interface) before a roof model or estimation report can be generated.

In view of existing technology in this field, what would be desirable is a system that processes aerial images of a building structure and automatically performs steps to quickly and efficiently assist a user in the roof estimation process. Specifically, what would be desirable is a system that automatically delineates roof boundaries in an image of a building or a structure with minimal user intervention, automatically creates a model of the roof structure, and automatically generates a roof estimation report which includes useful information about the roof including material costs and dimensions of the roof. Accordingly, what would be desirable, but has not yet been provided, is a system and method for construction estimation using aerial images which addresses the foregoing needs.

SUMMARY OF THE INVENTION

The present invention relates to a system and method for construction estimation using aerial images. The system includes a computer system for receiving at least one aerial image of a building, and an estimation engine for processing the aerial image to estimate one or more features relating to a roof of the building, the estimation engine histogram processing the aerial image at a plurality of angles to automatically identify a plurality of lines in the image corresponding to features of a roof the building.

A method for building estimation is also provided. The method comprises the steps of receiving at a computer system at least one aerial image of a building, histogram processing the aerial image at a plurality of angles using an estimation engine in the computer system to automatically identify a plurality of lines in the image corresponding to a plurality of feature of a roof of the building, constructing a three-dimensional wireframe model of the roof using the plurality of lines, and processing the three-dimensional model of the roof using the estimation engine to generate a report including information about the roof of the building.

A non-transitory, computer-readable medium is also provided. The computer readable medium includes computer-readable instructions stored thereon which, when executed by a computer system, cause the computer system to perform the steps comprising receiving at a computer system at least one aerial image of a building, histogram processing the aerial image at a plurality of angles using an estimation engine in the computer system to automatically identify a plurality of lines in the image corresponding to a plurality of feature of a roof of the building, constructing a three-dimensional wireframe model of the roof using the plurality of lines, and processing the three-dimensional model of the roof using the estimation engine to generate a report including information about the roof of the building.

BRIEF DESCRIPTION OF THE DRAWINGS

The foregoing features of the invention will be apparent from the following Detailed Description of the Invention, taken in connection with the accompanying drawings, in which.

DETAILED DESCRIPTION OF THE INVENTION

The present invention relates to a system and method for construction estimation using aerial images, as discussed in detail below in connection with FIGS. 1-6K.

Figure 1:
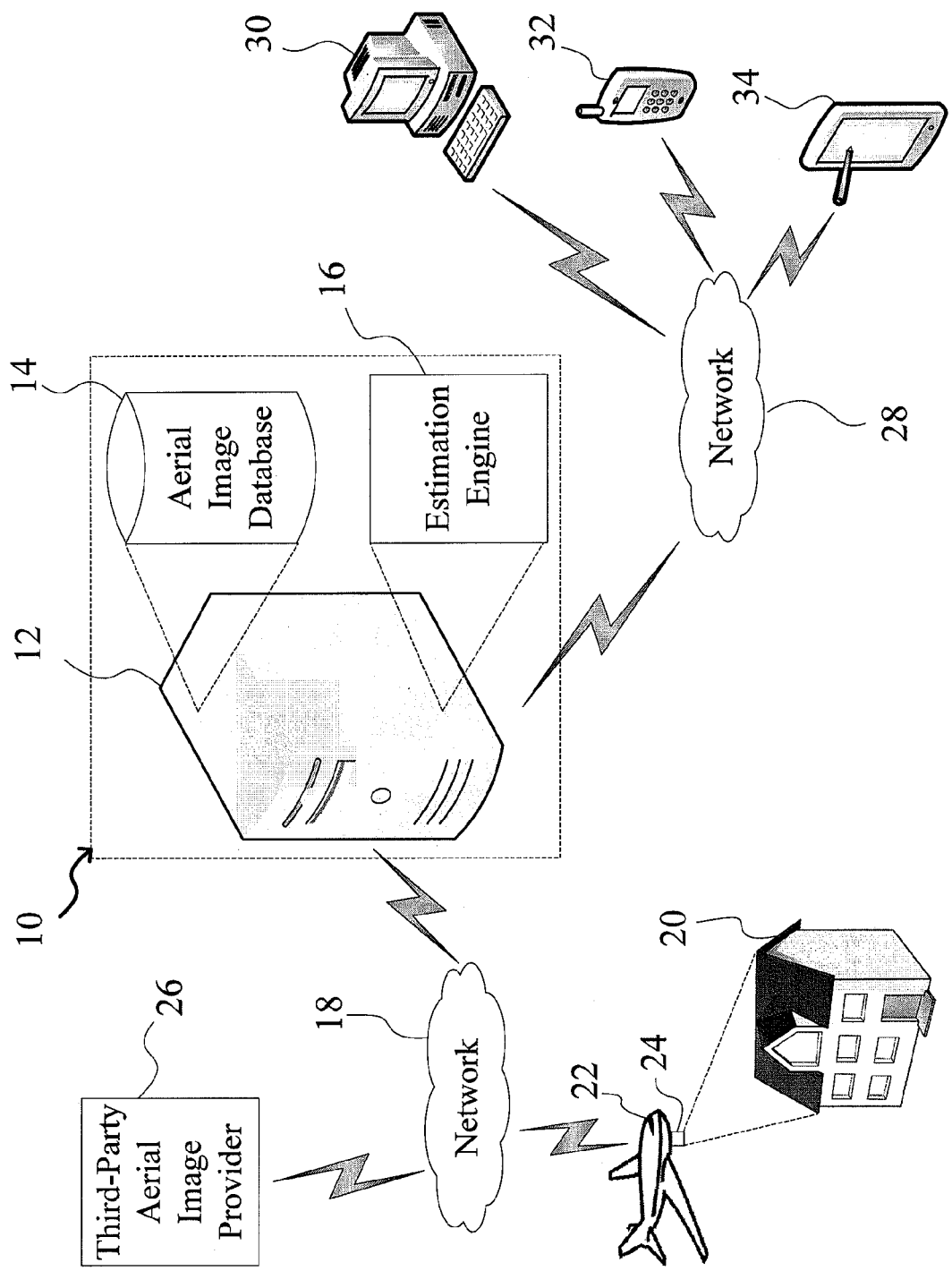
FIG. 1 is a diagram showing the system of the present invention for construction estimation using aerial images.

FIG. 1 is a diagram showing the system of the present invention, indicated generally at 10. The system 10 comprises a computer system 12 (e.g., a server) having an aerial image database 14 stored therein and an estimation software engine (module) 16. The database 14 could be stored on the computer system 12, or located externally (e.g., in a separate database server in communication with the system 10). As will be discussed in greater detail below, the estimation engine 16 allows users to generate three-dimensional models of roofs and buildings/structures to estimate dimensions of such structures as well as material costs and other parameters. Importantly, the estimation engine 16 allows users to easily generate such models by automatically delineating various roof structures such as eaves, hips, ridges, valleys, etc.

The system 10 can communicate through a network 18 with one or more of a variety of image providers to obtain aerial images or photographs of a building structure 20 and can store them in the aerial image database 14 in any suitable format, such as JPEG, TIFF, GIF, etc. Network communication could be over the Internet using standard TCP/IP communications protocols (e.g., hypertext transfer protocol (HTTP), secure HTTP (HTTPS), file transfer protocol (FTP), electronic data interchange (EDI), etc.), through a private network connection (e.g., wide-area network (WAN) connection, e-mails, electronic data interchange (EDI) messages, extensible markup language (XML) messages, file transfer protocol (FTP) file transfers, etc.), or any other suitable wired or wireless electronic communications format.

Image providers that the computer system 12 could communicate with include, but are not limited to, an airplane 22 having a camera 24 capable of capturing images of the structure 20, and/or a third-party aerial image provider 26, such as Pictometry, Google, or Bing. Although images of any quality can be used, high-quality images free from obstructions (e.g., trees, shadows, snow, etc.) are preferred.

The computer system 12 could be any suitable computer server (e.g., a server with an INTEL microprocessor, multiple processors, multiple processing cores) running any suitable operating system (e.g., Windows by Microsoft, Linux, etc.). The computer system 12 includes non-volatile storage, which could include disk (e.g., hard disk), flash memory, read-only memory (ROM), erasable, programmable ROM (EPROM), electrically-erasable, programmable ROM (EEPROM), or any other type of non-volatile memory. The estimation engine 16, discussed in greater detail below, could be embodied as computer-readable instructions stored in computer-readable media (e.g., the non-volatile memory mentioned above), and programmed in any suitable programming language (e.g., C, C++, Java, etc.).

The system 10 could be web-based and could allow for remote access to the system 10 over a network 28 (e.g., Internet, WAN, LAN, etc.) by one or more devices, such as a personal computer system 30, a smart cellular telephone 32, a tablet computer 34, or other devices. It is also contemplated that at least some of the functionality of the system 10 could run locally on devices (e.g., personal computer 30, smart cellular telephone 32, tablet computer 34, etc.) programmed with software in accordance with the present invention. It is conceivable that, in such circumstances, the device could communicate with a remote aerial image database over a network 28.

Figure 2:
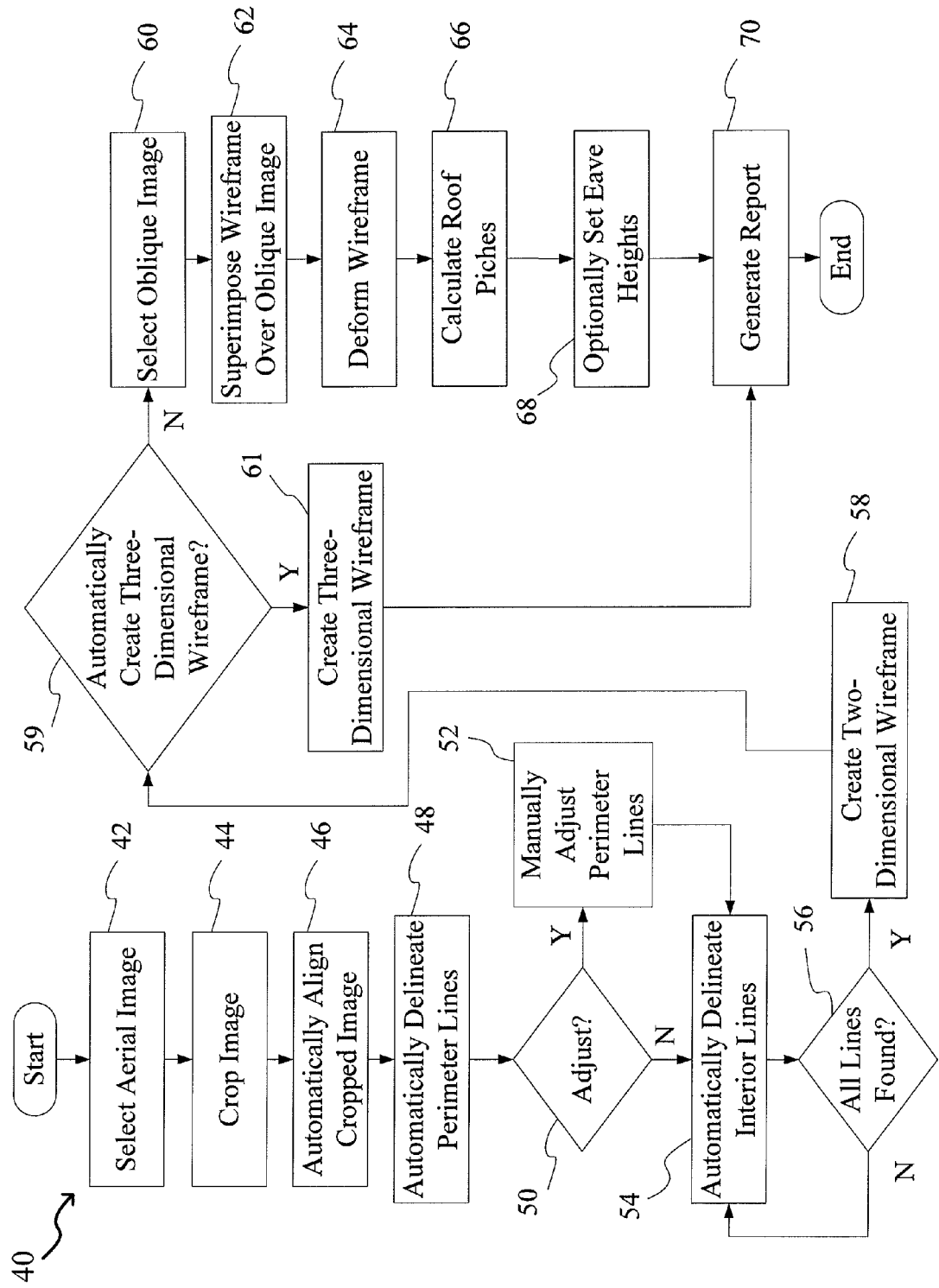
FIG. 2 is a flowchart showing overall processing steps carried out by the system of the present invention.
Figures 3A, 3B:
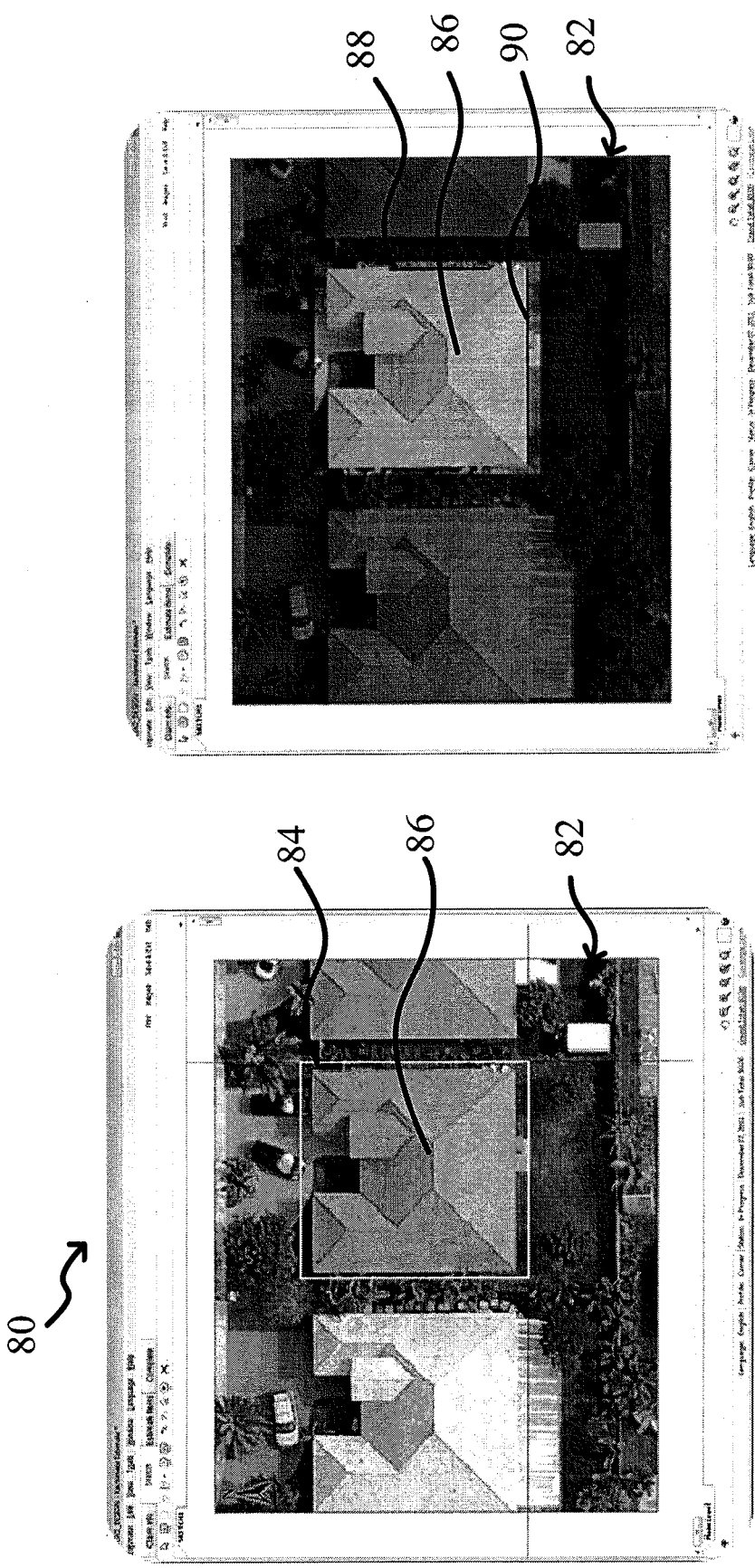
FIGS. 3A-3L are screenshots showing operation of the system of the present invention in detail.

FIG. 2 is a flowchart showing overall processing steps 40 carried out by the estimation engine 16 of the system 10. Reference is also made herein to FIGS. 3A-4B, which are views showing operation of the estimation engine 16. Beginning in step 42, as shown in FIG. 3A, a graphical user interface 80 is generated by the estimation engine 16 and presented to a user to allow the user to select an aerial image 82 of a building or structure, preferably from the aerial image database 14. Then, in step 44, the user can crop the image 82 by selecting a roof 86 from the image 82 using a selection tool 84 of the graphical user interface 80, e.g., by creating a box around the desired area. In step 46, as shown in FIG. 3B, the estimation engine 16 automatically rotates the roof 86 of the cropped image 82 so that the image 82 is aligned vertically and horizontally using roof lines 88, 90.

Figure 5:
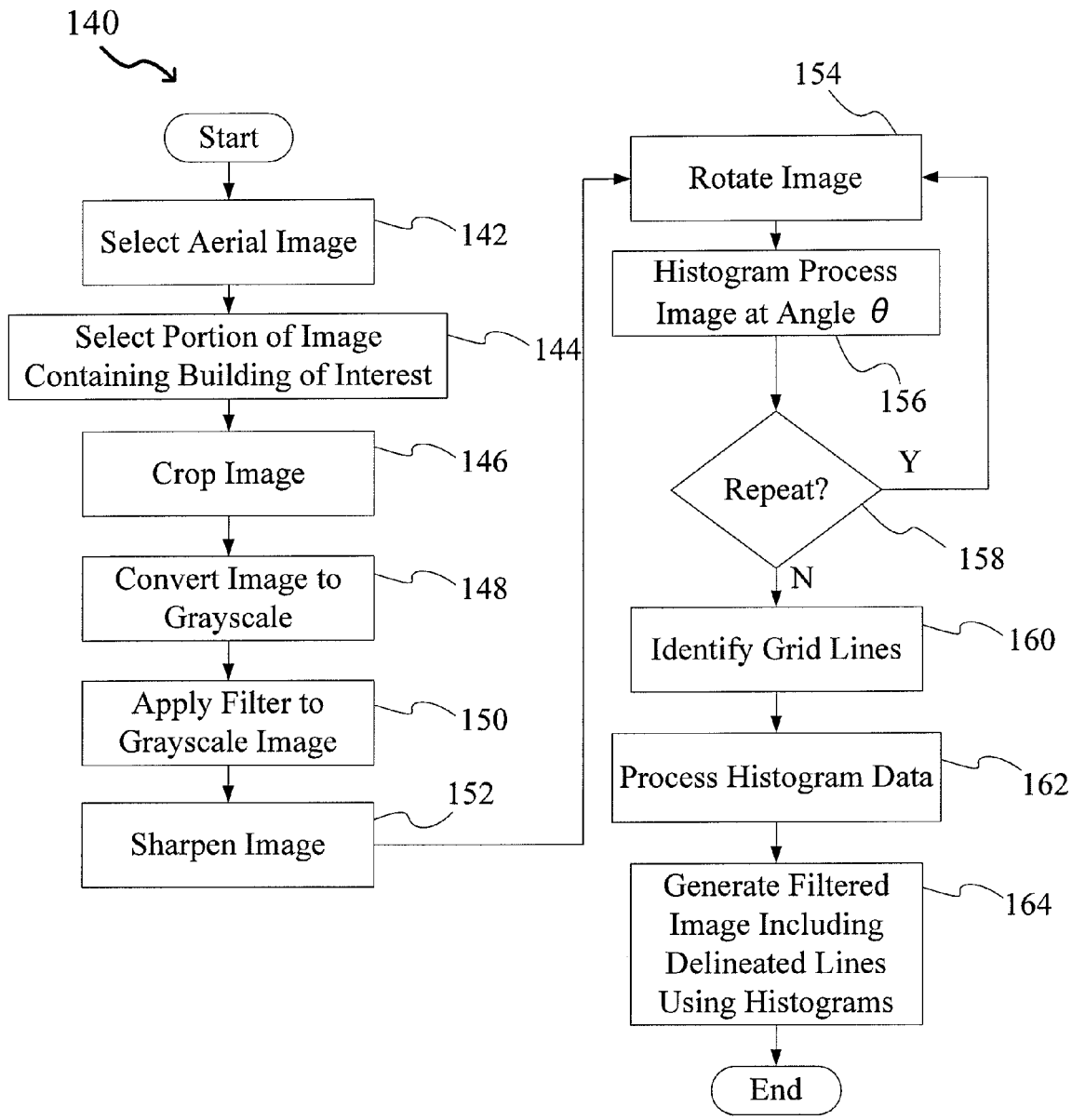
FIG. 5 is a flowchart showing processing steps carried out by the present invention for processing an aerial image to automatically identify roof lines.

The process for aligning the image 82 is described as follows. First, the processing steps discussed in detail below in connection with FIG. 5 are carried out to automatically identify perimeter and interior roof lines in the image. Using this information, a sequence of points are identified in each direction (e.g., 360 degrees) and are defined as rays in the set {raycast}, and include top ray {top}, bottom ray {bottom}, left ray {left}, and right ray {right}. Then, for each ray in the set {raycast}, the sequence of points is divided into |raycast|-2 subsets of two sequences made up of points {{0 . . . 1}, {2 . . . |raycast|-1}}, {{0 . . . 2}, {3 . . . |raycast|-1}} to {{0-|raycast| . . . 3}, {|raycast|-2 . . . |raycast|-1}} where |raycast| is the length of the sequence and 0 . . . 1 is the indices of the first and second point and 2 . . . |raycast|-1 is the remaining points in the sequence. For each of these subsequences {{0 . . . n}, {n+1 . . . |raycast|-1}}, the two point sets are treated as plots and their linear slope is found using linear regression. The difference between slopes is found, and only the maximum difference is retained. After iterating through every subsequence in the set {raycast}, if the maximum difference is greater than a specified threshold, the sequence is split at that point and the process is recursively repeated for each of the subsequences. Once all subsequences can no longer be divided, the length and slope of each subsequence is cached for further use. Finally, slopes are identified which are similar, and their lengths are combined. The slopes are then used to identify the roof lines 88, 90, which are then used to align the image 82 vertically and horizontally.

Figures 3C, 3D:
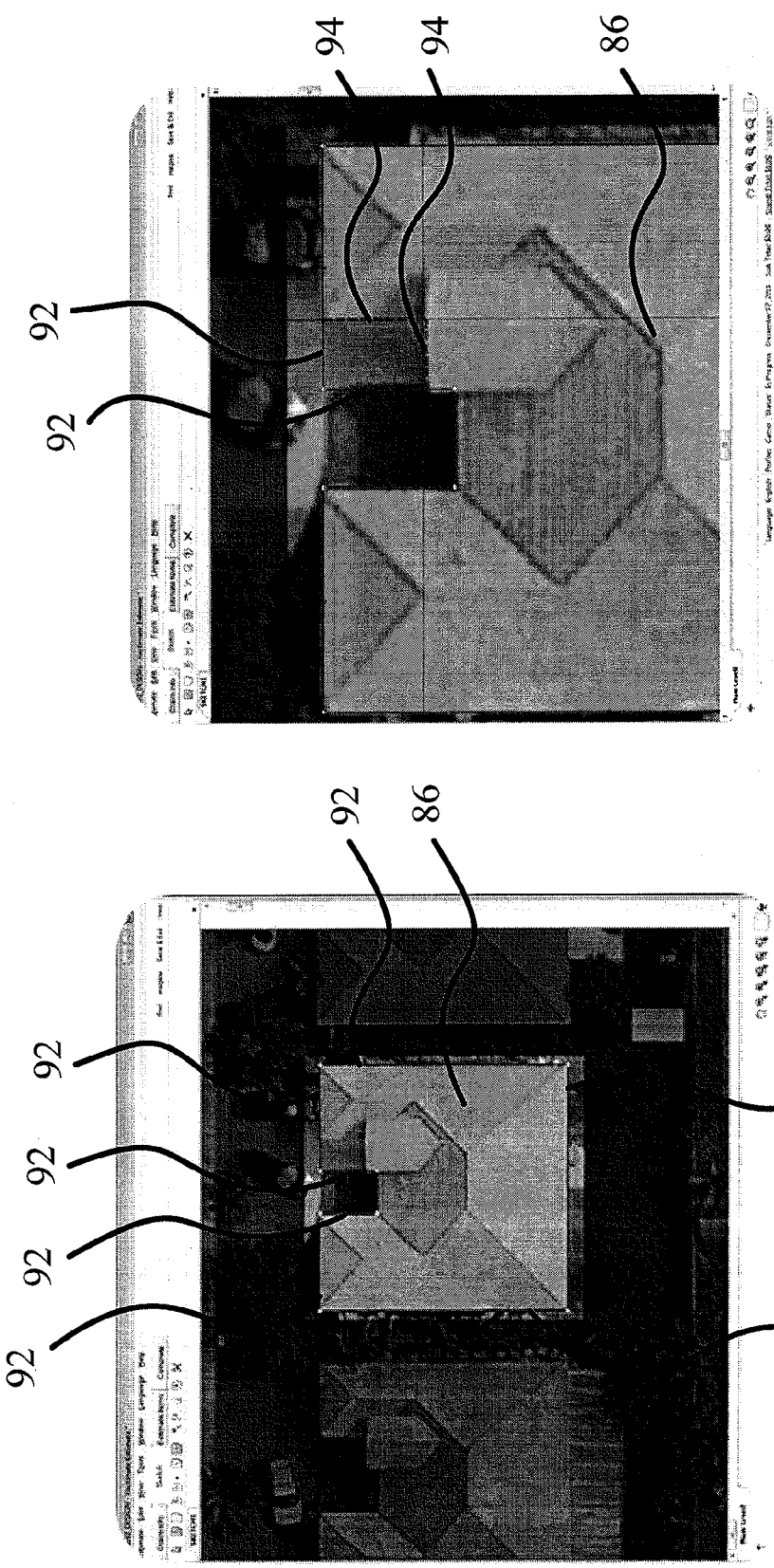

Then in step 48, as shown in FIG. 3C, the estimation engine 16 uses image processing algorithms to automatically identify and delineate perimeter lines 92 of the roof 86 to form a closed polygon or a bounded area. In step 50, a user decides whether the estimation engine 16 has correctly identified the perimeter lines 92 or whether adjustments or alterations must be made. If alterations are required, step 52 occurs where, as shown in FIG. 3D, the user manually adjusts the perimeter lines 92 to create corrected perimeter lines 94, such as by clicking on the corners of the roof 86 that were not correctly identified automatically. As the user clicks on or moves the cursor toward a roof feature (e.g., a corner), the estimation engine 16 could automatically suggest potential changes to the outline of the perimeter, by way of dashed lines 94 as shown in FIG. 3D. The user can confirm changes by clicking on the dashed lines 94, which converts the dashed lines to solid lines.

Figures 3E, 3F:
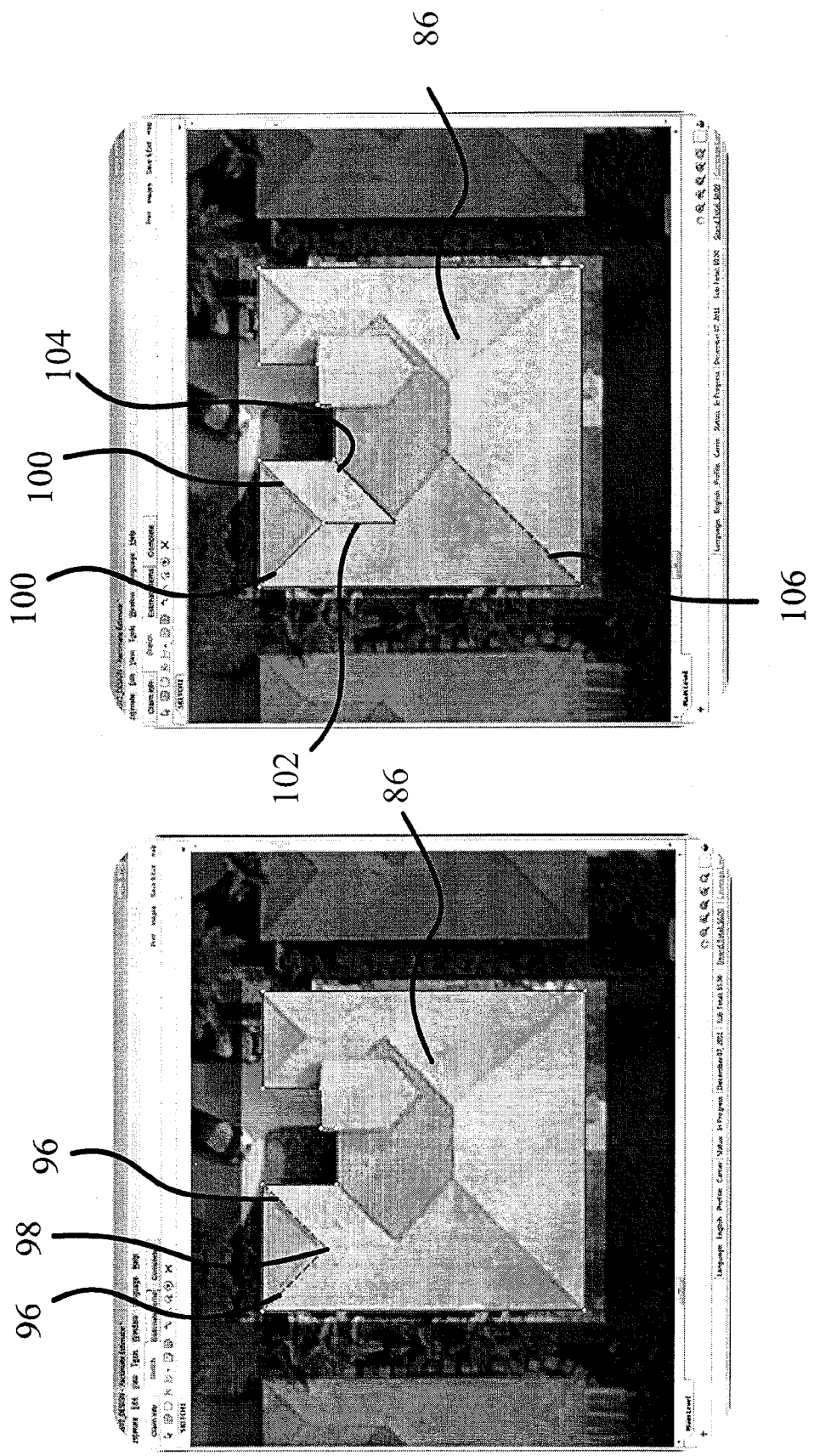

After perimeter line alterations have been made, or if no alterations are determined to be needed in step 50, the process proceeds to step 54 where, as shown in FIG. 3E, the estimation engine 16 automatically identifies and delineates interior lines 96 (e.g., ridges and valleys) and interior intersections 98 of the roof 86. Different roof features can be identified and distinguished using lines of different colors (e.g., ridges as red lines, valleys as blue lines, etc.). The user can move the mouse cursor over certain sections of the roof, such as intersection 98, and the system evaluates that section (e.g., by evaluating the proximity and configuration of existing adjacent points and other detected and identified lines) and automatically delineates colored dashed lines 96 as suggestions for lines to be included in the model. The user can then confirm the line, change the type of line, or reject the line. Once confirmed by the user, the dashed lines 96 are converted to solid lines 100, as shown in FIG. 3F. In step 56, a determination is made as to whether all lines have been found. If a negative determination is made, step 54 is repeated. Otherwise, if all lines have been identified (e.g., including the lines 102, 104, 106 in FIG. 3F, as well as any other lines corresponding to roof structures), a two-dimensional wireframe of the roof is created based on the perimeter lines and interior lines discussed above.

Figure 3H:
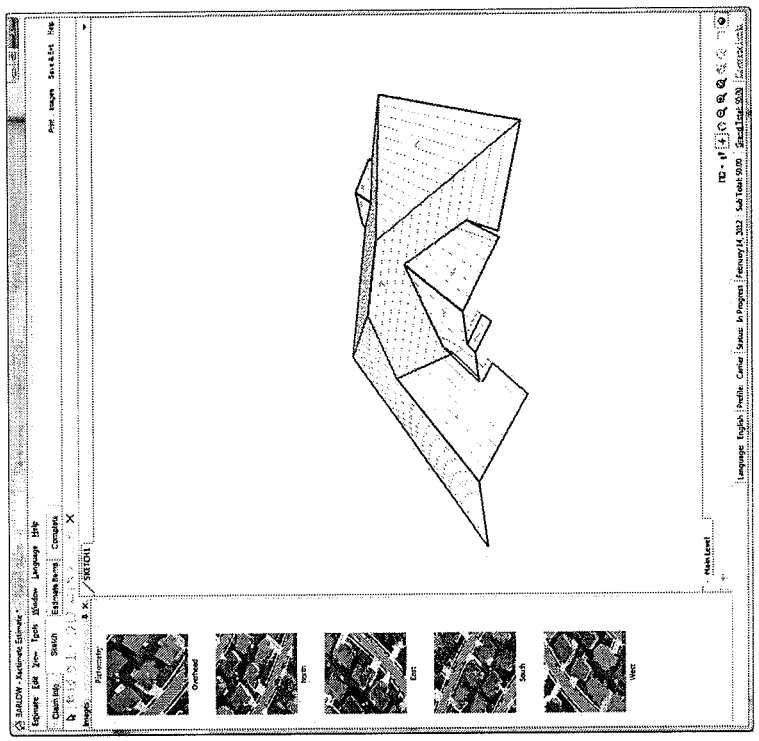
Figure 3G:
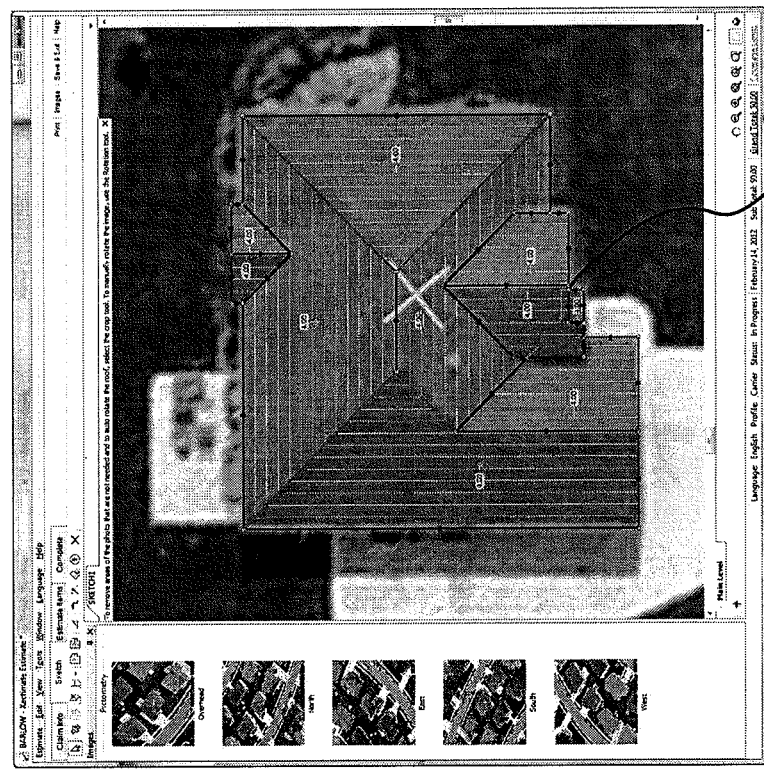

The two-dimensional model 110 is shown in FIG. 3G. The model 110 can be processed, either automatically by the engine 16 or through manual user manipulation, into a three-dimensional model. Thus, in step 59, a decision is made as to whether to automatically or manually create the three-dimensional model. If automatic creation is to be performed, a three-dimensional wireframe of the roof is created in step 61, based on the perimeter lines and interior lines. In this regard, the estimation engine 16 creates closed polygon surfaces, as shown in FIG. 3G, that represent the roof faces, and then calculates and assigns an orientation (e.g., direction of slope) based on roof constraints for each face. Using a center of mass calculation, the engine 16 selects a prominent face and assigns it a default slope. The slopes of the other faces are then iteratively calculated by the engine 16 based on constraints imposed by the relationship of lines between adjacent faces and orientations of the faces. Also, the user can manually enter a slope for a specific face and the engine 16 will recalculate the slope of the adjacent faces based on the manual slope entry. A three dimensional wireframe model is then created based on the slopes, as shown in FIG. 3H. The process then proceeds to step 70 discussed below.

Figure 3J:
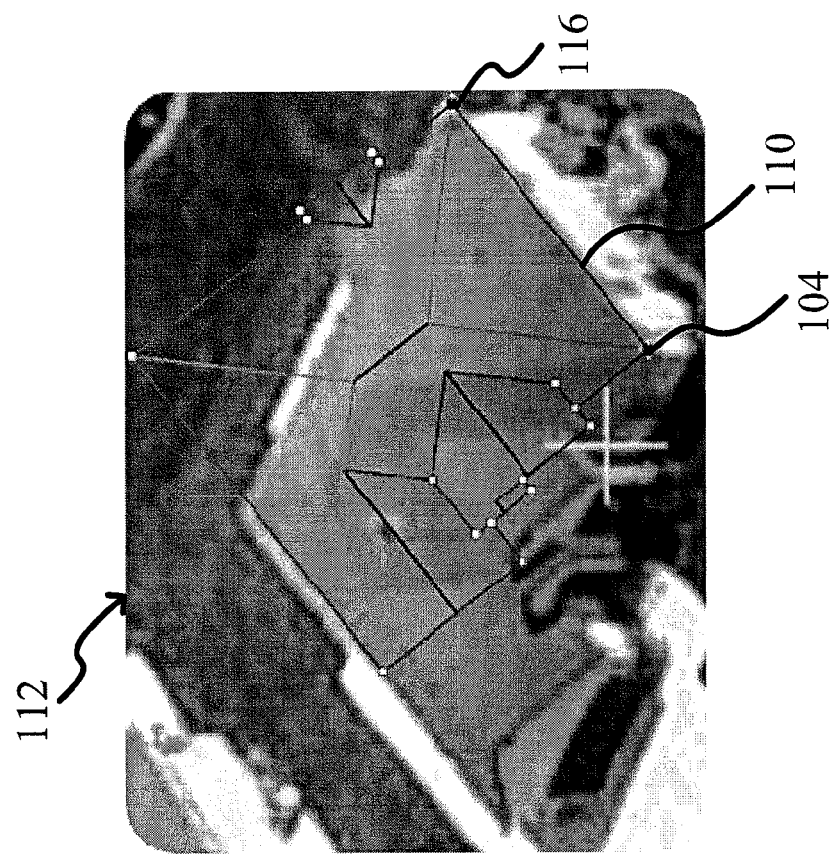
Figure 3I:
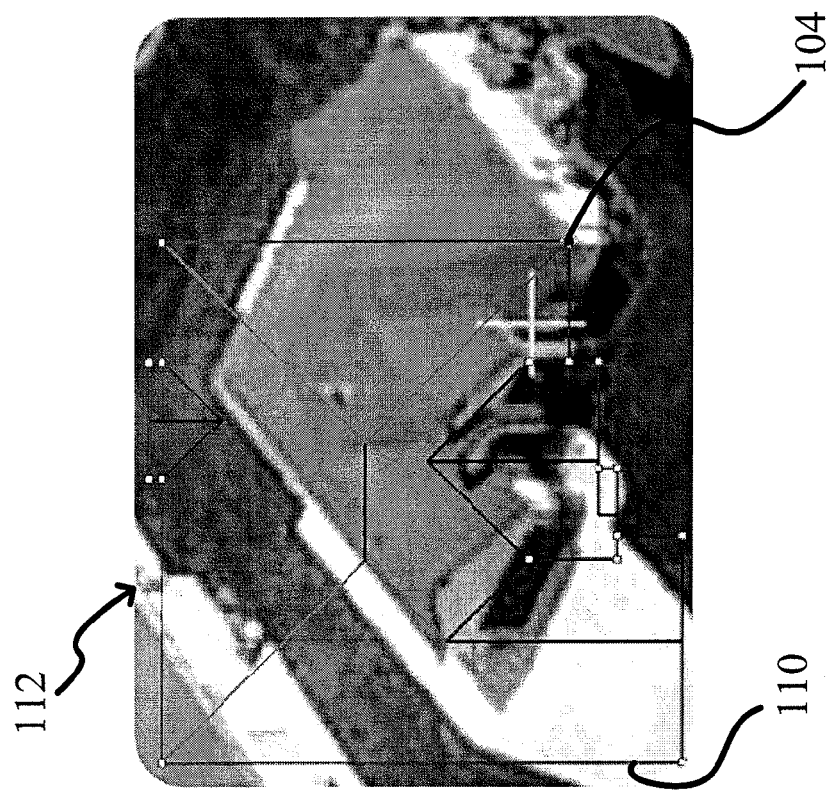
Figure 3K:
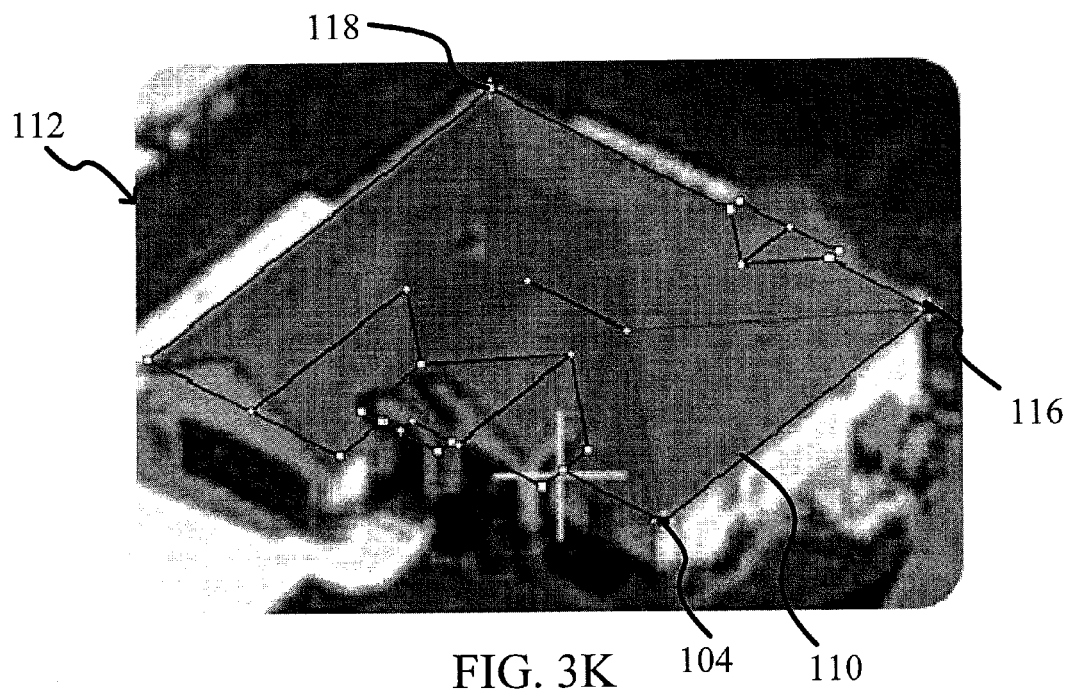
Figure 3L:
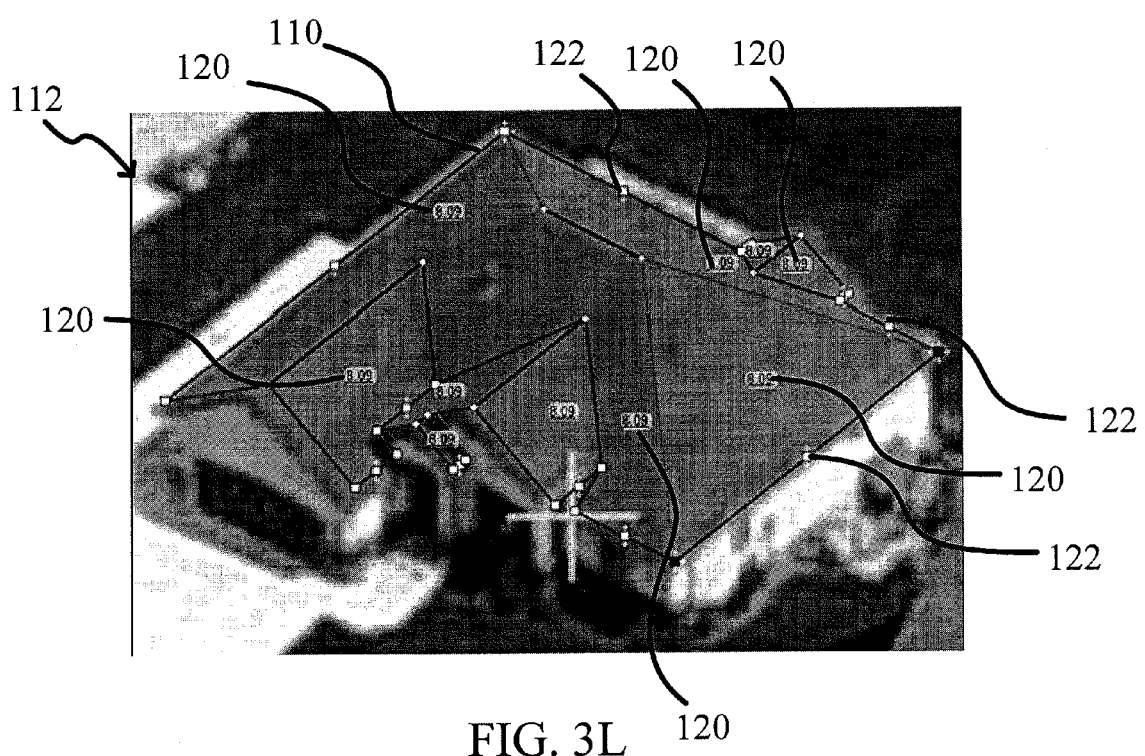

If manual creation of the three-dimensional model is to be performed, the process proceeds to step 60, as shown in FIG. 3I, where an oblique image 112 is selected, preferably from the aerial database 14. Then, in step 62, the wireframe 110 is superimposed over the oblique image 112 either by the user or automatically by the estimation engine 16. Then in step 64, as shown in FIGS. 3J-3K, a plurality of points on the wireframe 110 are matched with a plurality of corresponding points on the roof 86 of the oblique image 112, and the wireframe 110 is deformed as a result. The plurality of points could be on eave edges and/or at the same eave height. For example, a user could match three corners 104, 116, 118 of the wireframe 110 with three corresponding points of the roof 86 in the oblique image 112, causing the wireframe 110 to deform accordingly. Then, the user clicks and drags the interior points of the wireframe 110 to corresponding locations on the roof 86 of the oblique image 112 (e.g., the ridge lines of the roof 86), until the wireframe 110 outlines all of the perimeter lines and interior lines of the roof 86 in the oblique image 112. It is noted that this process could also be carried out automatically by the estimation engine 16. The final, deformed wireframe is shown in FIG. 3L. In step 66, the estimation engine 16 calculates roof pitches 120 based on the deformations of the superimposed wireframe 110, as shown in FIG. 3L.

In step 68, a user could optionally set eave heights to fine-tune the wireframe 110, and the estimation engine 16 would recalculate pitches based thereon. For example, the user could use an eave edit handle 122 on the midpoint of each eave line of the wireframe 110 to adjust the slope of one or more faces of the wireframe 110 by clicking and dragging. Alternatively, the user could click and drag the entire wireframe 110 until the eave line of the wireframe 110 overlays the eave line of the roof 86 of the oblique image 112.

Figure 4A:
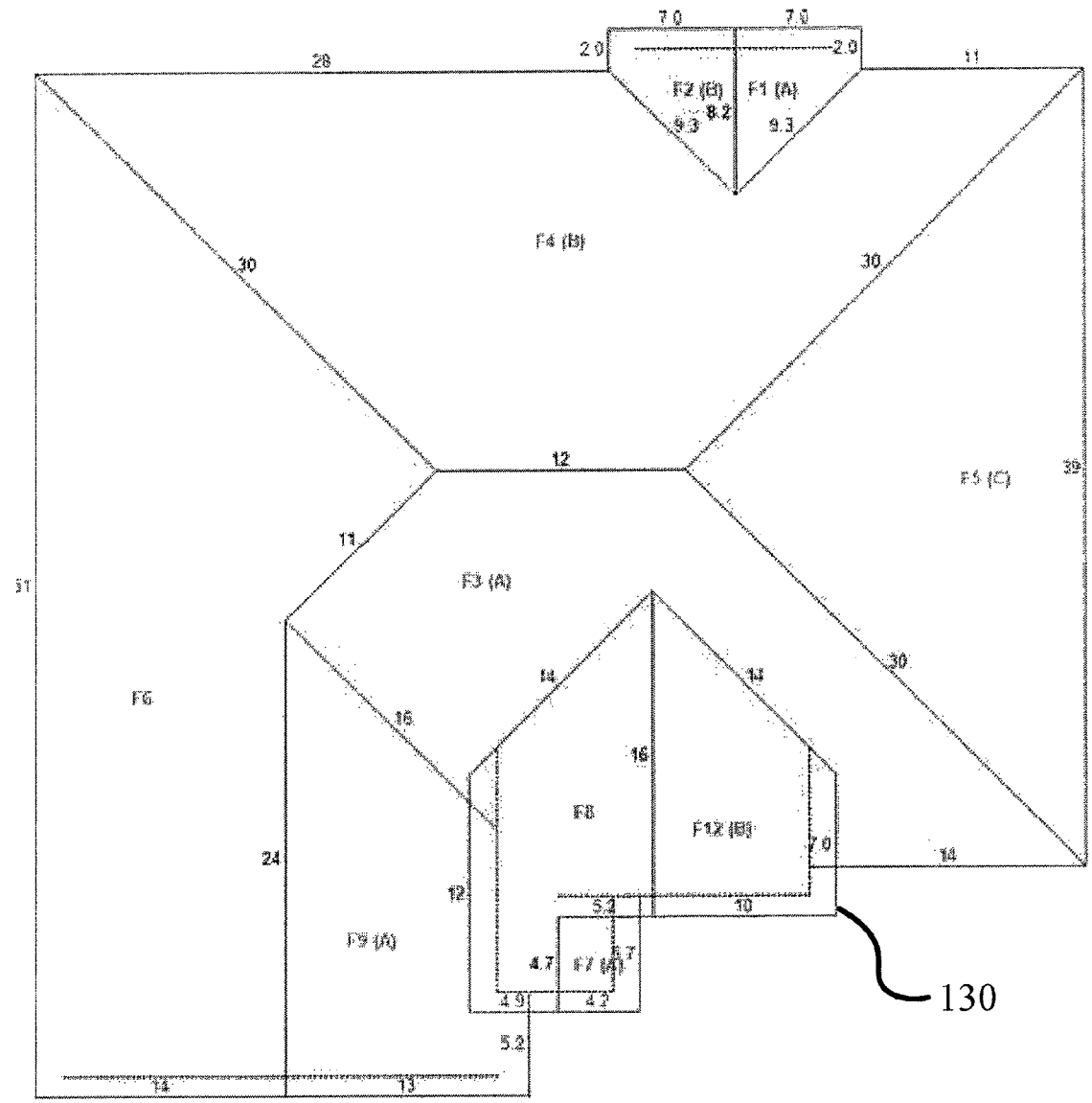
FIGS. 4A-4B are views of a sample estimation report generated by the present invention.
Figure 4B:
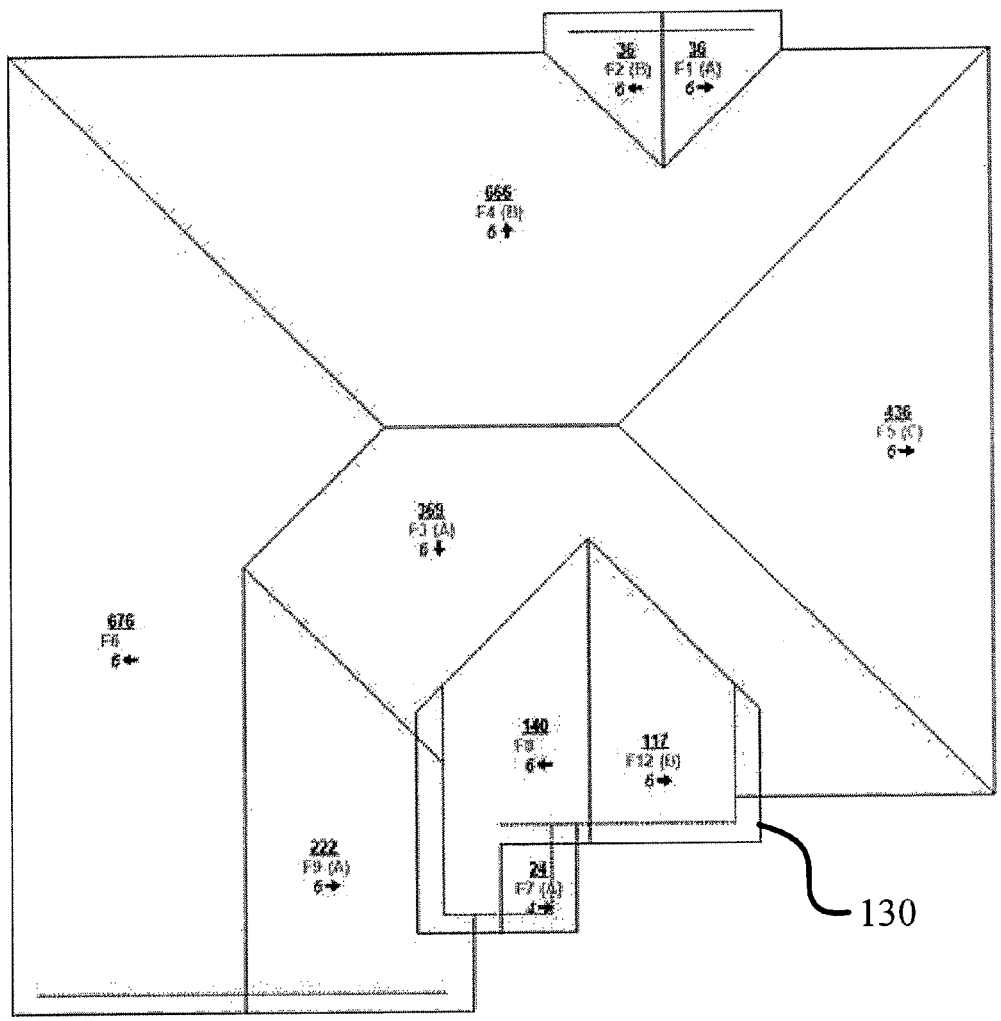

Proceeding to step 70, as shown in FIGS. 4A-4B, the system 10 generates a report. The report could comprise a two-dimensional wireframe model 130, a three-dimensional model, and/or one or more charts 132 containing construction information (e.g., roof dimensions, pitches, surfaces, and areas, and associated material costs). Other types of information, such as waste calculations, could also be included in the report. The report could have an XML flag as a way to verify that a roof model was created by the system 10. The system 10 could also require that a model have an XML flag before including the model in the report or before automatically generating the report.

Figure 6A:
FIGS. 6A-6K are views illustrating the steps of FIG. 5 for processing an aerial image to automatically identify roof lines.
Figure 6B:
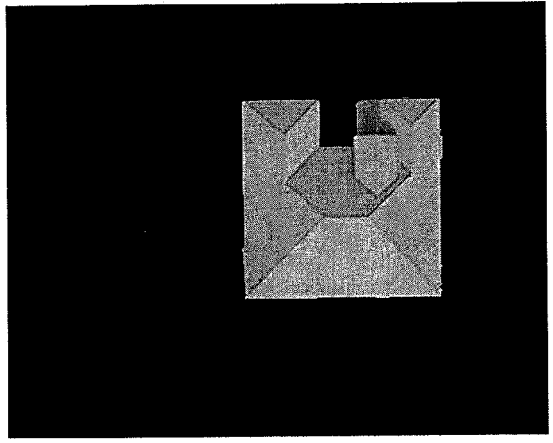
Figure 6C:
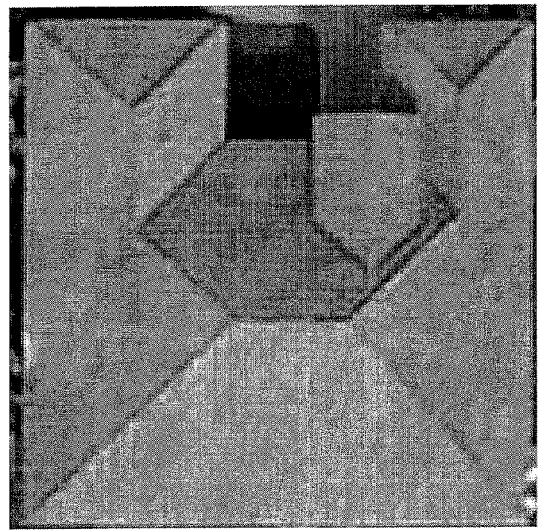
Figure 6D:
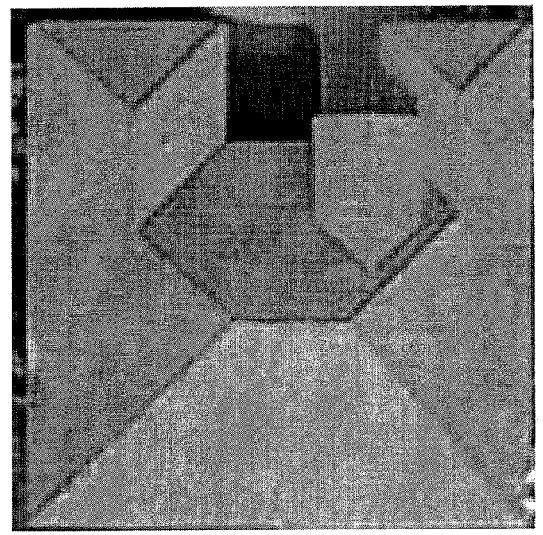
Figure 6E:
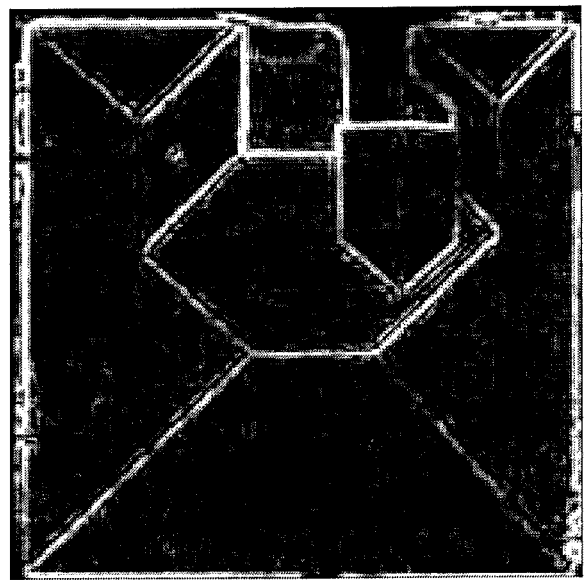
Figure 6F:
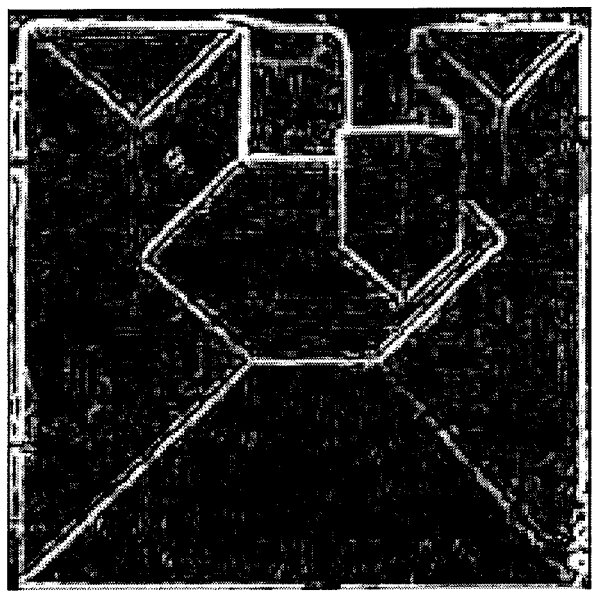

FIG. 5 is a flowchart showing more detailed processing steps 140 carried out by the estimation engine 16 for processing an aerial image to automatically identify roof lines. Reference is also made herein to FIGS. 6A-6K, which are views illustrating the steps carried out in FIG. 5. Beginning with step 142, as shown in FIG. 6A, an aerial image is selected. A portion of the image containing the roof is selected in step 144, as shown in FIG. 6B, and the image is then cropped in step 146, as shown in FIG. 6C. The image is then converted to grayscale in step 148, as shown in FIG. 6D. In step 150, as shown in FIG. 6E, a filter is applied to the grayscale image, such as a Sobel filter, although it is noted that a filter could be applied without first converting the image to grayscale. The Sobel filter calculates the gradient of image intensity at each point in the image, giving a direction and rate of change to the largest increases from light to dark. The estimation engine 16 computes the likelihood that a point in the image represents a perimeter or interior line of a roof based on the direction and magnitude of the greatest intensity increase. In step 152, as shown in FIG. 6F, a Gaussian filter or blur could be applied to the image to decrease blur and/or sharpen the image.

Figure 6G:
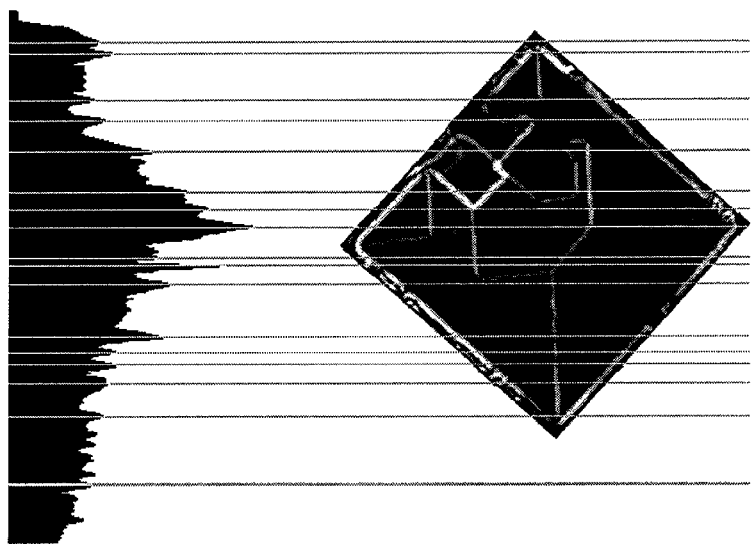
Figure 6H:
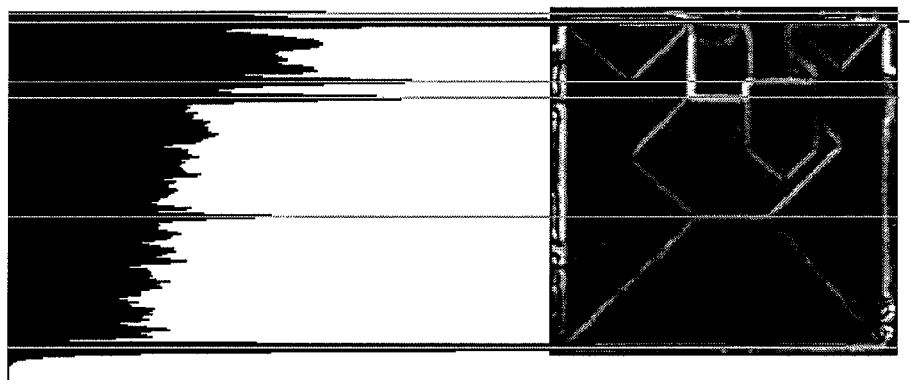
Figure 6I:
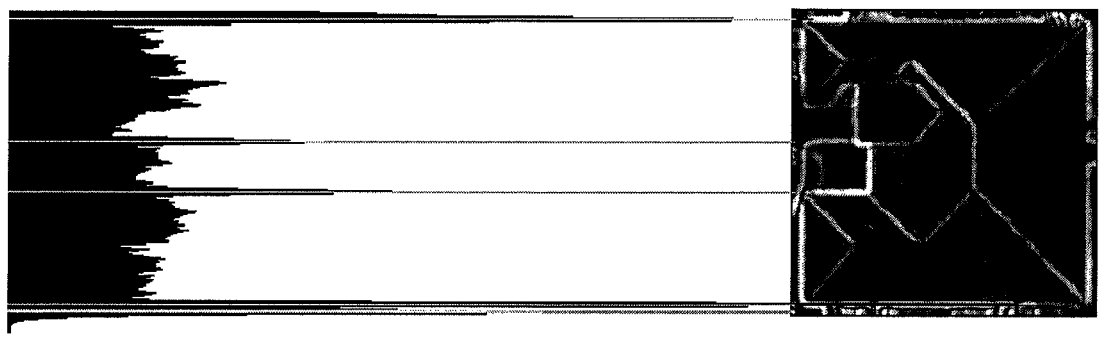

In step 154, as shown in FIG. 6G, the image is rotated by a first angle θ (e.g., 48 degrees), as shown in FIG. 6G, and then histogram processing is performed on the rotated image in step 156. The horizontal lines shown in FIGS. 6G-6I correspond to the direction of scan for image intensity. In step 158, a determination is made as to whether further histogram processing is required. If so, the process repeats until the image has been processed at a sufficient number of angles. It has been found that histograms taken at one degree increments (e.g., from 0 through 360 degrees) have provided excellent results, but other increments and/or number of histograms used are possible. Indeed, as shown in FIG. 6H, the image could be rotated to align vertically and then histogram processed, and/or the image could be rotated to align horizontally and then histogram processed, as shown in FIG. 6I. Of course any other angles could be used.

Figure 6J:
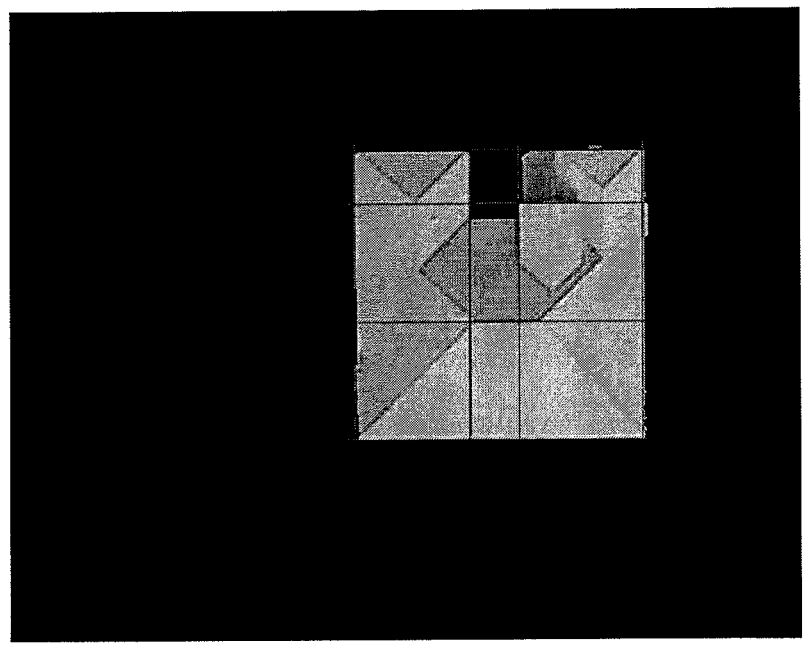

In step 160, as shown in FIG. 6J, grid lines could be superimposed on the image, such as at perimeter lines, interior lines, and/or points of intersection. The grid lines can be used to segment/divide the image into sub-images, each of which are processed in accordance with the present invention. The grid lines need not be shown to the user, and indeed, can be used solely for purposes of image processing.

Figure 6K:
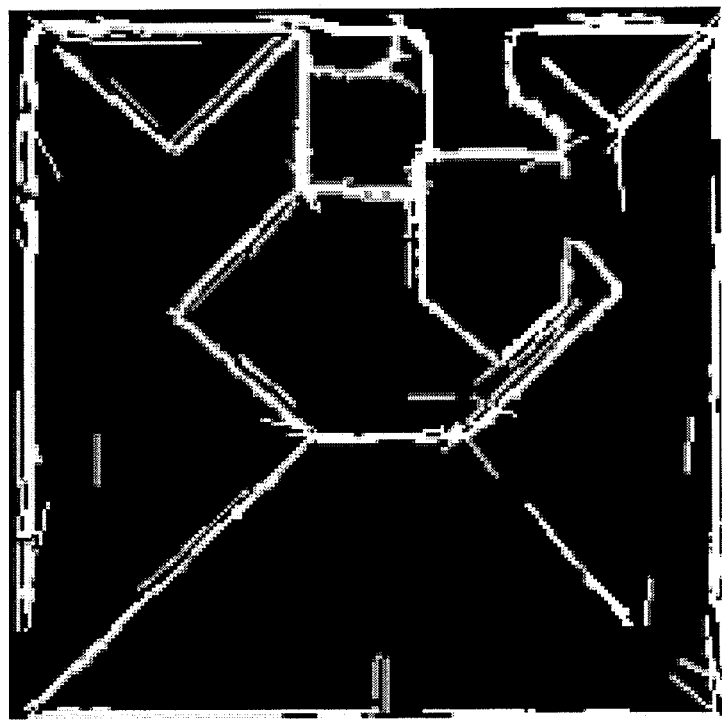

The histograms generated at the plurality of angles indicate the probability that a given feature in the image corresponds to a line (e.g., to a perimeter line or to an interior line corresponding a roof feature). In step 162, the histogram data (e.g., all of the histograms generated in steps 156-158) is processed to identify lines (e.g., perimeter and interior lines) corresponding to roof features. For example, in step 162, cluster analysis could be performed on the histograms to identify the lines (e.g., perimeter or interior lines). Thus, by application of the foregoing image processing techniques, the estimation engine 16 can scan the entire image and detect and identify all perimeter and interior lines. Finally, in step 164, as shown in FIG. 6K, a filtered image is generated and used by the estimation engine 16 to automatically delineate perimeter lines and interior lines in the GUI 80 shown in FIGS. 3A-3F.

As noted above, the estimation engine 16 can automatically identify the type of roof feature to which a given line in the model corresponds. This is accomplished by rules-based pattern recognition performed by the estimation engine 16, which could vary according to the type of roof feature to be automatically identified. For example, a set of rules could be programmed into the estimation engine 16 such that a ridge or a valley is automatically identified for a given point on the image if specific lines are detected in proximity to a given point in the image and/or if a predefined angle (or, range of angles) is detected between such lines. If the estimation engine 16 is unable to identify the type of line, the line could be temporarily marked as unknown and automatically altered by the estimation engine 16 as more information becomes available. Subsequently, the user could then manually correct the lines and line types if required.

Having thus described the invention in detail, it is to be understood that the foregoing description is not intended to limit the spirit or scope thereof. What is desired to be protected is set forth in the following claims.

What is claimed is:

1. A system for construction estimation, comprising:
   a computer system for receiving at least one aerial image of a building; and
   an estimation engine in said computer system for processing the aerial image to estimate one or more features relating to a roof of the building, the estimation engine:
      processing the aerial image with a filter to compute a likelihood for each point in the aerial image indicating whether the point represents a roof line;
      scanning the aerial image at a first angle to obtain first image intensity data;
      rotating the aerial image to a second angle different from the first angle;
      scanning the aerial image at the second angle to obtain second image intensity data;
      processing the first and second image intensity data to automatically identify a plurality of lines in the aerial image corresponding to one or more features of the roof;
      constructing a two-dimensional model of the roof using the plurality of lines identified in the aerial image; and
      manipulating the two-dimensional model into a three-dimensional model of the roof by displaying the two-dimensional model superimposed onto an oblique image of the roof and allowing the user to click and drag perimeter and interior points of the two-dimensional model to corresponding points on the oblique image of the roof.

2. The system of claim 1, further comprising a graphical user interface for displaying the aerial image of the building, the estimation engine automatically delineating the plurality of lines in the aerial image.

3. The system of claim 2, wherein the two-dimensional model further comprises a two-dimensional wireframe model of the roof, the two-dimensional wireframe model including the plurality of lines delineated by the estimation engine.

4. The system of claim 3, wherein the estimation engine superimposes the two-dimensional wireframe model of the roof on the oblique image.

5. The system of claim 4, wherein the three-dimensional model comprises a three-dimensional wireframe model of the roof.

6. The system of claim 5, wherein the estimation engine processes the three-dimensional wireframe model to calculate roof dimensions and pitches, and generates a report including the calculated roof dimensions and pitches.

7. The system of claim 5, wherein the estimation engine processes the three-dimensional wireframe model to calculate material costs associated with the roof, and generates a report including the calculated material costs.

8. The system of claim 1, wherein the estimation engine crops the aerial image around the building.

9. The system of claim 8, wherein the estimation engine automatically aligns the aerial image.

10. The system of claim 9, wherein the estimation engine applies at least one filter to the image.

11. The system of claim 1, wherein the estimation engine allows a user to adjust one or more of the plurality of lines automatically identified by the estimation engine.

12. The system of claim 1, wherein the estimation engine automatically identifies perimeter and interior lines in the aerial image corresponding to one or more features of the roof.

13. A method for construction estimation, comprising the steps of:
   receiving at a computer system at least one aerial image of a building;
   processing the aerial image with a filter to compute a likelihood for each point in the aerial image indicating whether the point represents a roof line;
   scanning the aerial image at a first angle to obtain first image intensity data;
   rotating the aerial image to a second angle different than the first angle;
   scanning the aerial image at the second angle to obtain second image intensity data;
   processing the first and second image intensity data using an estimation engine in the computer system to automatically identify a plurality of lines in the aerial image corresponding to a plurality of features of a roof;
   constructing a two-dimensional model of the roof using the plurality of lines;
   manipulating the two-dimensional model into a three-dimensional model of the roof by displaying the two-dimensional model superimposed onto an oblique image of the roof and allowing the user to click and drag perimeter and interior points of the two-dimensional model to corresponding points on the oblique image of the roof; and
   processing the three-dimensional model of the roof using the estimation engine to generate a report including information about the roof of the building.

14. The method of claim 13, further comprising generating and displaying a graphical user interface including the aerial image of the building, the estimation engine automatically delineating the plurality of lines in the graphical user interface.

15. The method of claim 13, wherein the step of generating the two-dimensional model comprises generating a two-dimensional wireframe model of the roof, the wireframe model including the plurality of lines.

16. The method of claim 15, further comprising superimposing the two-dimensional wireframe model of the roof on the oblique image.

17. The method of claim 16, wherein the step of manipulating the two-dimensional model comprises deforming the two-dimensional wireframe model into a three-dimensional wireframe model of the roof.

18. The method of claim 13, further comprising processing the three-dimensional model to calculate roof dimensions and pitches, and including the calculated roof dimensions and pitches in the report.

19. The method of claim 13, further comprising processing the three-dimensional model to calculate material costs associated with the roof, and including the calculated material costs in the report.

20. The method of claim 13, further comprising cropping the aerial image around the building.

21. The method of claim 20, further comprising automatically aligning the aerial image.

22. The method of claim 21, further comprising applying at least one filter to the image.

23. The method of claim 13, further comprising allowing a user to adjust one or more of the plurality of lines automatically identified by the estimation engine.

24. The method of claim 13, further comprising automatically identifying perimeter and interior lines in the aerial image corresponding to one or more features of the roof.

25. A non-transitory, computer-readable medium having computer-readable instructions stored thereon which, when executed by a computer system, cause the computer system to perform the steps comprising:
receiving at the computer system at least one aerial image of a building;
processing the aerial image with a filter to compute a likelihood for each point in the aerial image indicating whether the point represents a roof line;
scanning the aerial image at a first angle to obtain first image intensity data;
rotating the aerial image to a second angle different than the first angle;
scanning the aerial image at the second angle to obtain second image intensity data;
processing the first and second image intensity data using an estimation engine in the computer system to automatically identify a plurality of lines in the aerial image corresponding to a plurality of features of a roof;
constructing a two-dimensional model of the roof using the plurality of lines;
manipulating the two-dimensional model into a three-dimensional model of the roof by displaying the two-dimensional model superimposed onto an oblique image of the roof and allowing the user to click and drag perimeter and interior points of the two-dimensional model to corresponding points on the oblique image of the roof
processing the model of the roof using the estimation engine to generate a report including information about the roof of the building.

26. The computer-readable medium of claim 25, further comprising computer-readable instructions for causing the computer system to perform the steps of generating and displaying a graphical user interface including the aerial image of the building, the estimation engine automatically delineating the plurality of lines in the graphical user interface.

27. The computer-readable medium of claim 25, wherein the step of creating the two-dimensional model comprises generating a two-dimensional wireframe model of the roof, the wireframe model including the plurality of lines.

28. The computer-readable medium of claim 27, further comprising computer-readable instructions for causing the computer system to perform the step of superimposing the two-dimensional wireframe model of the roof on the oblique image.

29. The computer-readable medium of claim 28, wherein the step of manipulating the two-dimensional model comprises deforming the two-dimensional wireframe model into a three-dimensional wireframe model of the roof.

30. The computer-readable medium of claim 25, further comprising computer-readable instructions for causing the computer system to perform the steps of processing the three-dimensional model to calculate roof dimensions and pitches, and including the calculated roof dimensions and pitches in the report.

31. The computer-readable medium of claim 25, further comprising computer-readable instructions for causing the computer system to perform the steps of processing the three-dimensional model to calculate material costs associated with the roof, and including the calculated material costs in the report.

32. The computer-readable medium of claim 25, further comprising computer-readable instructions for causing the computer system to perform the step of cropping the aerial image around the building.

33. The computer-readable medium of claim 32, further comprising computer-readable instructions for causing the computer system to perform the step of automatically aligning the aerial image.

34. The computer-readable medium of claim 33, further comprising computer-readable instructions for causing the computer system to perform the step of applying at least one filter to the image.

* * * * *